(12) United States Patent
Ho et al.

(10) Patent No.: US 7,405,528 B2
(45) Date of Patent: Jul. 29, 2008

(54) GLOBAL CLOSED LOOP CONTROL SYSTEM WITH DV/DT CONTROL AND EMI/SWITCHING LOSS REDUCTION

(75) Inventors: Eddy Ying Yin Ho, Torrance, CA (US); Yong Li, Torrance, CA (US); Jun Honda, El Segundo, CA (US); David Tam, Manhattan Beach, CA (US); Toshio Takahashi, Rancho Palos Verdes, CA (US)

(73) Assignee: International Rectifier Corporation, El Segundo, CA (US)

( * ) Notice: Subject to any disclaimer, the term of this patent is extended or adjusted under 35 U.S.C. 154(b) by 144 days.

(21) Appl. No.: 11/337,282

(22) Filed: Jan. 23, 2006

(65) Prior Publication Data
US 2006/0119303 A1    Jun. 8, 2006

Related U.S. Application Data

(62) Division of application No. 10/625,958, filed on Jul. 24, 2003, now Pat. No. 7,061,195.

(60) Provisional application No. 60/399,368, filed on Jul. 25, 2002, provisional application No. 60/398,621, filed on Jul. 25, 2002.

(51) Int. Cl.
*G05B 5/01* (2006.01)
(52) U.S. Cl. ............... 318/400.25; 318/448; 318/456; 327/381
(58) Field of Classification Search ............ 318/400.19, 318/400.22, 400.23, 400.24, 400.25, 448, 318/456, 700; 327/170, 379–381, 387–391, 327/434
See application file for complete search history.

(56) References Cited

U.S. PATENT DOCUMENTS 4,310,866 A    1/1982  Wirth
5,191,269 A *  3/1993  Carbolante ............... 318/254

(Continued)

FOREIGN PATENT DOCUMENTS

JP           3-261376          11/1991

(Continued)

OTHER PUBLICATIONS

Vishay document No. 70579, "Si9910 Adaptive Power mosfet Driver Improves Performance in High-Voltage Half-Bridge Applications", Feb. 15, 1994. Also see www.vishay.com.*

*Primary Examiner*—Bentsu Ro
(74) *Attorney, Agent, or Firm*—Ostrolenk, Faber, Gerb & Soffen, LLP

(57) ABSTRACT

A motor drive system control provides global closed loop feedback to cooperatively operate system components to adaptively reduce noise and provide noise cancellation feedback. An active EMI filter reduces differential and common mode noise on an input and provides a noise level indication to a system controller. Power switches in both a power converter and power inverter are cooperatively controlled with dynamic dv/dt control to reduce switching noise according to a profile specified by the controller. The dv/dt control is provided as an analog signal to a high voltage IC and codified as a pulse width for a level shifting circuit supplying control signals to the high voltage gate drive. A noise extraction circuit and technique obtain fast noise sampling to permit noise cancellation and adaptive noise reduction.

10 Claims, 7 Drawing Sheets

U.S. PATENT DOCUMENTS

| | | | |
|---|---|---|---|
| 5,235,504 A | 8/1993 | Sood | 363/53 |
| 5,363,020 A | 11/1994 | Chen et al. | 315/209 |
| 5,583,423 A | 12/1996 | Bangerter | 323/239 |
| 6,118,239 A | 9/2000 | Kadah | 318/268 |
| 6,127,746 A * | 10/2000 | Clemente | 307/131 |
| 6,271,709 B1 * | 8/2001 | Kimura et al. | 327/380 |
| 6,459,324 B1 * | 10/2002 | Neacsu et al. | 327/379 |
| 6,507,167 B2 | 1/2003 | Han et al. | 318/729 |
| 6,567,283 B2 | 5/2003 | Welches | |
| 6,839,249 B2 | 1/2005 | Kalman et al. | 363/35 |

FOREIGN PATENT DOCUMENTS

| | | |
|---|---|---|
| JP | 8-98536 | 4/1996 |
| JP | 9-65644 | 3/1997 |
| JP | 9-140144 | 5/1997 |
| JP | 9-205765 | 8/1997 |
| JP | 2000-102290 | 4/2000 |
| JP | 2001-45742 | 2/2001 |
| JP | 2001-57781 | 2/2001 |
| JP | 2002-95263 | 3/2002 |
| JP | 2002-165475 | 6/2002 |
| JP | 2002-199700 | 7/2002 |

\* cited by examiner

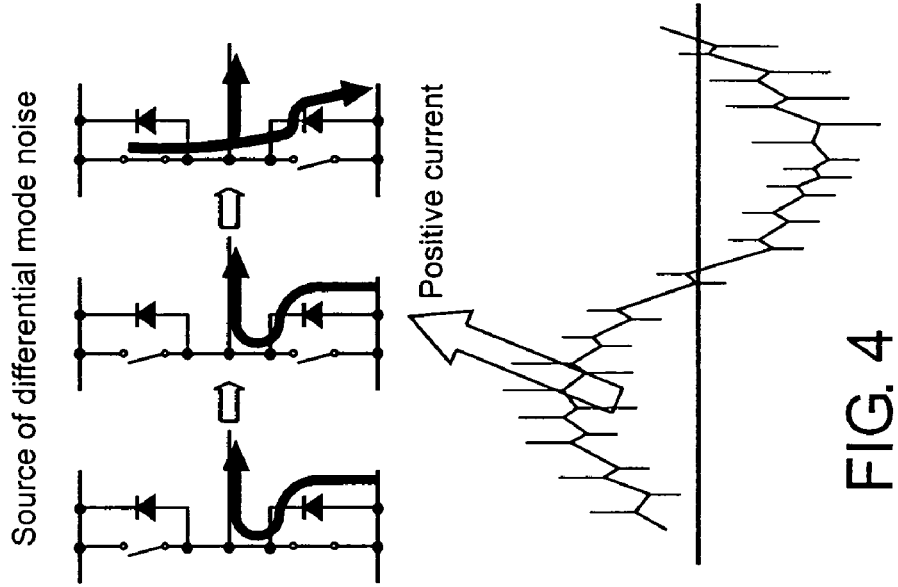
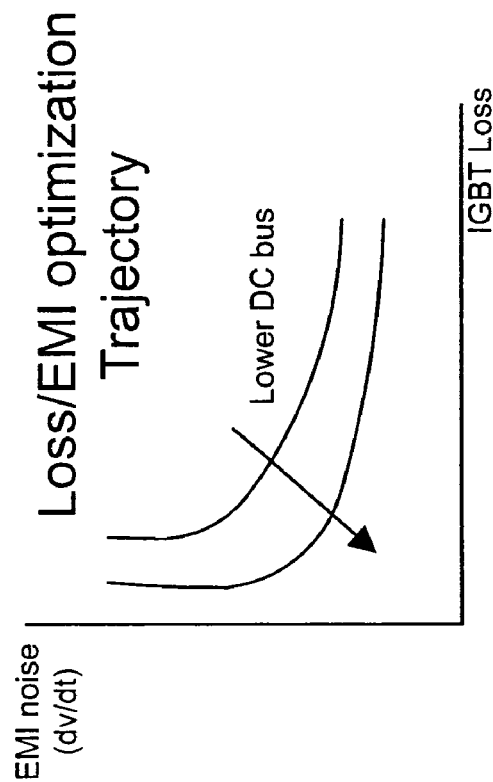
FIG. 4
FIG. 3

GLOBAL CLOSED LOOP CONTROL SYSTEM WITH DV/DT CONTROL AND EMI/SWITCHING LOSS REDUCTION

RELATED APPLICATIONS

This is a divisional of U.S. patent application Ser. No. 10/625,958 filed Jul. 24, 2003, now U.S. Pat. No. 7,061,195 and entitled GLOBAL CLOSED LOOP CONTROL SYSTEM WITH DV/DT CONTROL AND EMI/SWITCHING LOSS REDUCTION which is based on and claims benefit of U.S. Provisional Application Ser. No. 60/399,368, filed Jul. 25, 2002, entitled EMI/LOSS OPTIMIZATION SYSTEM WITH GLOBAL CLOSED LOOP CONTROL, and is based on and claims benefit of U.S. Provisional Application Ser. No. 60/398,621, filed Jul. 25, 2002, entitled DV/DT CONTROLLED GATE DRIVE HVIC, a claim of priority being hereby made to all of the above applications.

BACKGROUND OF THE INVENTION

1. Field of the Invention

The present invention relates generally to closed loop power control systems, and relates more particularly to closed loop power control systems with reduced EMI and switching losses and control of the rate of change of gate drive signals.

2. Description of Related Art

High-speed switching devices such as bipolar transistors, MOSFETs and IGBT's enable increased carrier frequency for voltage-source PWM inverters, thus leading to much better operating characteristics. High-speed switching, however, causes the following serious problems, originating from a high rate-of-change in voltage and/or current:

a) ground current escaping to earth through stray capacitors inside motors and through long cables;

b) conducted and radiated EMI;

c) motor bearing current and shaft voltage; and d) shortening of insulation life of motors and transformers.

The voltage and/or current change caused by high-speed switching produces high-frequency oscillatory common-mode and differential-mode currents when the switching device(s) change state because parasitic stray capacitance inevitably exists inside a load, for example, an ac motor, as well as inside the switching converter. Thus, each time an inverter switching event occurs, the potential of the corresponding inverter output terminal moves rapidly with respect to ground, and a pulse of common mode current flows in the d-c link to the inverter, via the capacitance of the heatsink motor cable and motor windings to ground. The amplitude of this pulse of current for a class B (residential) motor drive is typically several hundred millamps to several amps; and the pulse width is typically 250 to 500 ns. For a class A drive (Industrial), and depending on the size of the motor and length of the motor cable, the pulse current amplitude is typically several amperes with a pulse width of 250 ns to 500 ns, to 20 amperes or more with a pulse width of 1 to 2 μs.

The common mode oscillatory currents may have a frequency spectrum range from the switching frequency of the converter to several tens of MHZ, which creates a magnetic field and will produce radiated electromagnetic interference (EMI) throughout, thus adversely affecting electronic devices such as radio receivers, medical equipment, etc.

A number of Governmental restrictions apply to the degree of permissible line current EMI and permissible ground current in certain motor applications. Thus, in Class B residential (appliances), applications, ground current must be kept below from 1 to 20 mA over a frequency range from 0 to 30 kHz respectively (over a logarithmic curve); and conducted line current EMI must be kept below designated values (less than about 60 dB*V) over a frequency range of 150 kHz to 300 MHZ. For motor drive applications designated as class A Industrial applications, limitations on ground current are less stringent, but line current EMI is still limited over the 150 kHz to 30 MHZ range.

Generally, common-mode chokes and EMI filters, based on passive elements, may not completely solve these noise and EMI problems. Passive filters, consisting of a common mode inductor and "Y" capacitors in the input ac line have been used to filter the common mode current in such motor drive circuits. Passive common mode filters may place limits on the PWM frequency which can be used, are physically large (frequently a major fraction of the volume of the motor drive structure) and are expensive. Further, they are functionally imperfect in that they exhibit undesired resonance which runs counter to the desired filtering action. Further, in general purpose industrial drives, the drive circuit and motor are often connected by cables which are up to 100 meters or more long. The longer the cable, the greater the conducted common mode EMI in the motor cable, and the larger the required size of a conventional passive common mode input filter.

A common-mode transformer with an additional winding shorted by a resistor is known which can damp the oscillatory ground current. Unfortunately, a small amount of aperiodic ground current will still remain in this circuit.

Active filters for control of the common mode current in a pulse width modulated (PWM) controlled motor drive circuit are well known. Typical devices are described in the paper an Active Circuit for Cancellation of Common-Mode Voltage Generated by a PWM Inverter, by Satoshi Ogasawara et al., IEES Transactions on Power Electronics, Vol. 13, No. 5, (September 1998 and in U.S. Pat. No. 5,831,842 in the names of Ogasawara et al.

FIG. 10 shows a typical prior art active filter circuit or EMI and noise cancellation device for an a-c motor. Thus, in FIG. 10, an a-c source comprising an input terminal L and a neutral terminal are connected to the a-c input terminals of a full wave bridge connected rectifier 40. While a single phase supply is shown, the principles in this and in all Figures to be described can be carried out with a three-phase or multi-phase input. The positive and negative busses of rectifier 40 contain points A and D respectively and are connected to a three-phase bridge connected PWM controlled inverter 41, at inverter terminals B and F. The output a-c terminals of the inverter are connected to a-c motor 42. A filter capacitor 40a is also connected across terminals B and F. Motor 42 has a grounded housing connected to ground wire 43 with ground terminal 43a.

The active filter consists of a pair of transistors Q1 and Q2, connected across the d-c output lines of rectifier 40 with their emitters connected at node E. These define amplifiers which are controlled by output winding 44 of a differential transformer having input windings 45 and 46 connected in the positive and negative output busses of rectifier 40. The winding polarities are designated by the conventional dot symbols. Winding 44 is connected between the control terminals of transistors Q1 and Q2 and the common emitter node E. A d-c isolating capacitor 47 is connected to ground line 43 at node C.

The active filter including capacitor 47 defines a path for diverting the majority of the common mode current which can otherwise flow in the path L or N, A, B, M (motor 42), 43, 43a and back to L or N; (or in the reverse path when polarity reverses) or in path L or N, D, F, M, 43, 43a (or in the reverse path when polarity reverses). Thus, most common mode current can be diverted, for currents from positive terminal A, in the path B, M, C, E, Q2, F, B, for "positive current", and in the pattern B, M, C, E, Q1, B for "negative" current. by the proper control of transistor Q1 and Q2. The path for common mode current flowing into negative terminal D follows the path F, M, C, E, Q2, F for "positive" current and F, M, C, E, Q1, B for "negative" current. The degree of diversion depends on the current gain of winding 44 and the current gain of Q2, for "positive current", and the current gain of winding 44 and current gain of Q1, for "negative" current. In order to obtain a sufficient degree of diversion of the common mode current, the overall current gain of winding 44 and transistors Q1 and Q2 must be high.

The sensing transformer 44, 45, 46 of FIG. 10 has been large and expensive in order to provide sufficiently high current gain. It would be very desirable to reduce the size and cost of this transformer without jeopardizing the operation of the circuit. A further problem is that because of the high gain required, this closed-loop circuit has a tendency to produce unwanted oscillation.

Further, it has been found that the transistors Q1 and Q2 may not be able to operate in their linear regions over a large enough range within the "headroom" defined by the circuit, thus defeating the active filtering action. The headroom, or the voltage between the collector and emitter of transistors Q1 and Q2 is best understood by considering the approximate equivalent circuit of FIG. 10, as shown in FIG. 11, in which the ground potential at C is the same as that of the neutral line in FIG. 10. Transistors Q1 and Q2 are shown as resistors R1 and R2 respectively with respective parallel connected diodes. The d-c bridge 40 is shown as two d-c sources 50 and 51, each producing an output voltage of VDC/2 where VDC is the full output voltage between the positive and negative busses at terminals A and D, and an a-c source 52 having a peak a-c voltage of VDC/2.

It can be seen from FIG. 11 that headroom can disappear at different portions of the cycle of source 52. Thus, consider a first situation in which the leakage impedances of transistors Q1 and Q2 are the same. In this case, the values of resistors R1 and R2 in FIG. 2 are about equal. Now, as the ground potential at terminal C swings between (+)VDC/2 and (−)VDC/2 with respect to the d-c midpoint at node 53 in FIG. 2, the potential at the emitters of transistors Q1 and Q2 also swings between (+)VDC/2 and (−)VDC/2, if it is assumed that the impedance of capacitor 47 is much smaller than R1 and R2. Therefore, during the periods when the potential at node E is close or equal to the potential of the d-c bus (at points B or F), insufficient voltage headroom exists for the relevant transistors Q1 or Q2 to operate as linear amplifiers, and the active filtering action is lost.

The above described filters are well known in a number of electromagnetic applications, particularly in power transfer systems. Systems involving power transfer typically include power inverters that can be used for power supply applications in addition to motor drives. Power inverters are typically supplied with electrical power through power transmission lines that are operated in a multi-phase mode. For example, a three phase power supply is typical in applications involving inverter operation and motor drives. A three phase power supply includes three transmission lines with a voltage potential between the three pairs of power delivery lines. That is, if the three phase input is supplied through lines L1, L2 and L3, there is a voltage potential between lines L1 and L2, between lines L2 and L3, and between lines L1 and L3. These phase-to-phase voltages are typically sinusoidal and out of phase with respect to each other to provide efficient power transfer.

In a three phase system like that described above, the transmission lines act as differential voltage pairs in transmitting a power signal that is the value of the voltage between the various line pairs. This type of power transmission scheme is very useful in transmitting a power signal with immunity to noise interruptions that affect all the power lines at the same time. That is, if all of the power lines are impacted by a common interference or noise signal, all lines are affected to the same degree and the differential voltages remain the same. Accordingly, it is often the case that three phase transmission lines carry a common mode voltage that does not necessarily impact the power signals delivered to an inverter, for example.

When an inverter is used to power and control a motor drive system, the inverter typically uses high frequency switching to direct the appropriate power signals to the motor windings to produce the desired operation performance. For example, the inverter can be operated to control the motor for a specified torque operation, or a desired velocity. Due to the high frequency switching of the inverter, it is often the case that there are abrupt voltage transitions on the lines driving the motor, which are an inherent source of EMI. This EMI can produce common mode noise that causes interference in motor control signals, feedback signals I/O, sensors and the like. In addition, capacitive coupling with inverter outputs and ground, or the motor grounding by itself can produce high frequency ground currents that provide further interference with control signals and other communication signals. High frequency ground currents can also lead to radiated interference and produce ground loops that act as loop antennas to increase the production of radiated noise. The high frequency ground currents can also result in instantaneous voltage differences between two ground potential points, which interferes with appropriate references for control and communication signals.

In addition to the above mentioned filters, a number of measures are available to reduce and control common mode noise and radiated EMI. For example, shielded power cables are used to connect the inverter to the motor to prevent noise current from flowing out of the motor drive system to ground. The power lines to the motor are also twisted to provide a balanced capacitive coupling to reduce the stray capacitive coupling to ground. A common mode choke is often used on the power lines in the motor to attenuate the common mode noise as well. An EMI filter like that described above is often attached to the input of the inverter to act as a low pass filter to remove common mode noise from the earth ground that might otherwise create a ground voltage differential for one or more components of the motor drive system.

Another technique to reduce EMI noise is to measure high frequency noise current and provide compensation for any detected currents. As described above and in other prior art a current transformer has been used to sense noise current to determine appropriate compensation to control EMI. However, an appropriately sized and rated current transformer is bulky and expensive, and produces non-linear operation in practice. It would be desirable to provide a circuit and technique for reducing EMI without the use of a current transformer.

Often, an EMI reduction system is part of a large closed loop control for operating a synchronous motor with the inverter. For example, multiple high level systems can provide command and control signals to the inverter controller to operate the motor or power supply in conjunction with related high level systems. Accordingly, it would be desirable to reduce the EMI production of the overall system, in addition to the closed loop control involving the inverter and sensor feedback.

In the high voltage inverter system, level shifters are often used to provide control signals to the half bridges that make up the various stages of the motor drive inverter. In the level shifting system, references are changed typically from a logic voltage level to a reference level consistent with the inverter power supply. As a result, control signals are transmitted by the level shifting circuit in the form of pulses to avoid the additional energy losses resulting from power switches being maintained in a power conduction mode to permit signal transmission. Accordingly, an input signal is provided to a pulse generator that supplies a pulse train with a duty cycle representative of the input signal. The pulse train is then converted to a control signal for controlling the gate drive in the application. Often, due to the nature of high frequency, high power switching, voltage spikes on both the gate drive and half bridge components with a tremendous voltage change per unit time are observed. It would be desirable to reduce or control the change in voltage per unit time to prevent voltage spikes, which can result in excessive EMI and other disruptive control operations. Presently known solutions for controlling the dv/dt of high frequency high power switching applications are bulky, complex and costly. Accordingly, it would be desirable to obtain a simple control for high voltage, high frequency switching applications to modulate the dv/dt of inverter gate drives.

In a motor drive with an inverter, space vector modulation is often used to control the motor based on quadrant switching of switches in the inverter. In this type of motor control, accurate motor phase current measurements are useful to provide high performance control for a particular application, such as velocity or torque control. However, it is often difficult to accurately measure motor phase current over a wide current and temperature ranges. For example, Hall effect sensors can be used in the lines driving the motor, but they are inherently bulky and costly. In a pulse width modulated (PWM) inverter drive system, motor phase current can be determined from measurement of the d-c bus current when non zero basic vectors are used in the space vector modulation. Each basic vector is assigned a specific time in a PWM cycle to generate the command voltage vector. However, if a basic voltage vector is used only for a very short period of time, motor phase current cannot be directly determined from the d-c bus current. This lack of observability of motor phase current is due to practical considerations and limitations in the responsiveness of components of the PWM inverter drive system. For example, time delays caused by a/d converter sample and hold times, slewing of voltage during turn on, and other delay factors prevent the effects of basic vectors used for a very short time from being observed. Accordingly, it would be desirable to observe the effects of basic vectors used for a very short time, and to obtain overall values of motor phase currents for all control periods to achieve a high performance motor drive.

SUMMARY OF THE INVENTION

In accordance with the present invention, a closed loop control system for global synchronous motor control and synchronized switching to reduce EMI production is provided. The global control in accordance with the present invention offers dynamic bus voltage control with dynamic dv/dt control for inverter gate drives. A number of closed loop control parameters are sensed and provided as inputs to algorithms related to optimizing system operations. The consolidated control system provides power factor correction control through a dynamic switching scheme to permit zero voltage switching with minimal current. Active EMI filtering provides a tremendous reduction in common mode and differential mode noise in the system. The control system obtains an estimation of motor current by measuring only the dc bus voltage provided to the inverter. Algorithms for synchronizing switching between the inverter and the power factor correction circuit, as well as adaptive EMI noise reduction, increase the efficiency of the overall system and produce a more reliable and cost effective overall motor drive system solution. In addition, the system control provides an interactive look ahead control scheme to coordinate the power factor correction and inverter operation for improved operational reliability and efficiency. Through the use of these techniques in an overall global closed loop control system, a reliable and efficient overall system is realized, with a potential for reduction of component sizes due to decreased voltage and current ratings required for components. In addition, due to the increased efficiency of the overall system operation, major passive components with high tolerance ratings can be tremendously reduced, or even eliminated in some cases.

The invention provides control for a voltage rate of change per unit time in turning on or turning off the power switches of the power converter or power inverter of the motor drive system. An analog signal from the controller is supplied to the high voltage gate drive integrated circuit to specify the change in voltage per unit time to be applied in switching the power switch to which the gate drive is connected. In the case of a high side, high voltage switch, as is typically found in a half bridge switching arrangement, the gate command signal is level shifted to be referenced to the switching voltage for the high side power switch. The control signal for the voltage change per unit time is codified in the level shifted gate command signal through the use of pulse width modulation. The gate command signal is broken into pulses for starting and stopping a switching event, and a width of the pulses indicates the desired control for the voltage rate of change per unit time to be applied to the switching event.

There is a tradeoff between EMI noise reduction through control of the change in voltage per unit time applied to the gate of the power switches, and switching losses in the power switches. Accordingly, the control of the present invention obtains an optimized control profile that is adapted to changes in noise levels, switching losses and desired control profiles. For example, the control can be modified to improve the reduction of differential mode noise, or improve the reduction of common mode noise.

Noise signals can be quickly measured according to the present invention by extracting an indication of noise energy from the noise signal and providing a synchronized signal related to the extracted energy. The information in the signal is converted to a machine readable format, with an a/d converter, for example. The motor drive system controller can use the noise signal information to cancel noise in the system, or change the operating points of various components to reduce generated noise.

BRIEF DESCRIPTION OF THE DRAWINGS

The present invention will be explained in greater detail below with reference to the accompanying drawings, in which:

FIG. 3 is a graph illustrating the relationship between EMI noise impacted by dv/dt control and switching losses;

FIG. 4 is an abstract circuit diagram of a half bridge switch configuration for modeling sources of differential mode noise;

DETAILED DESCRIPTION OF THE PREFERRED EMBODIMENTS

Figure 1:
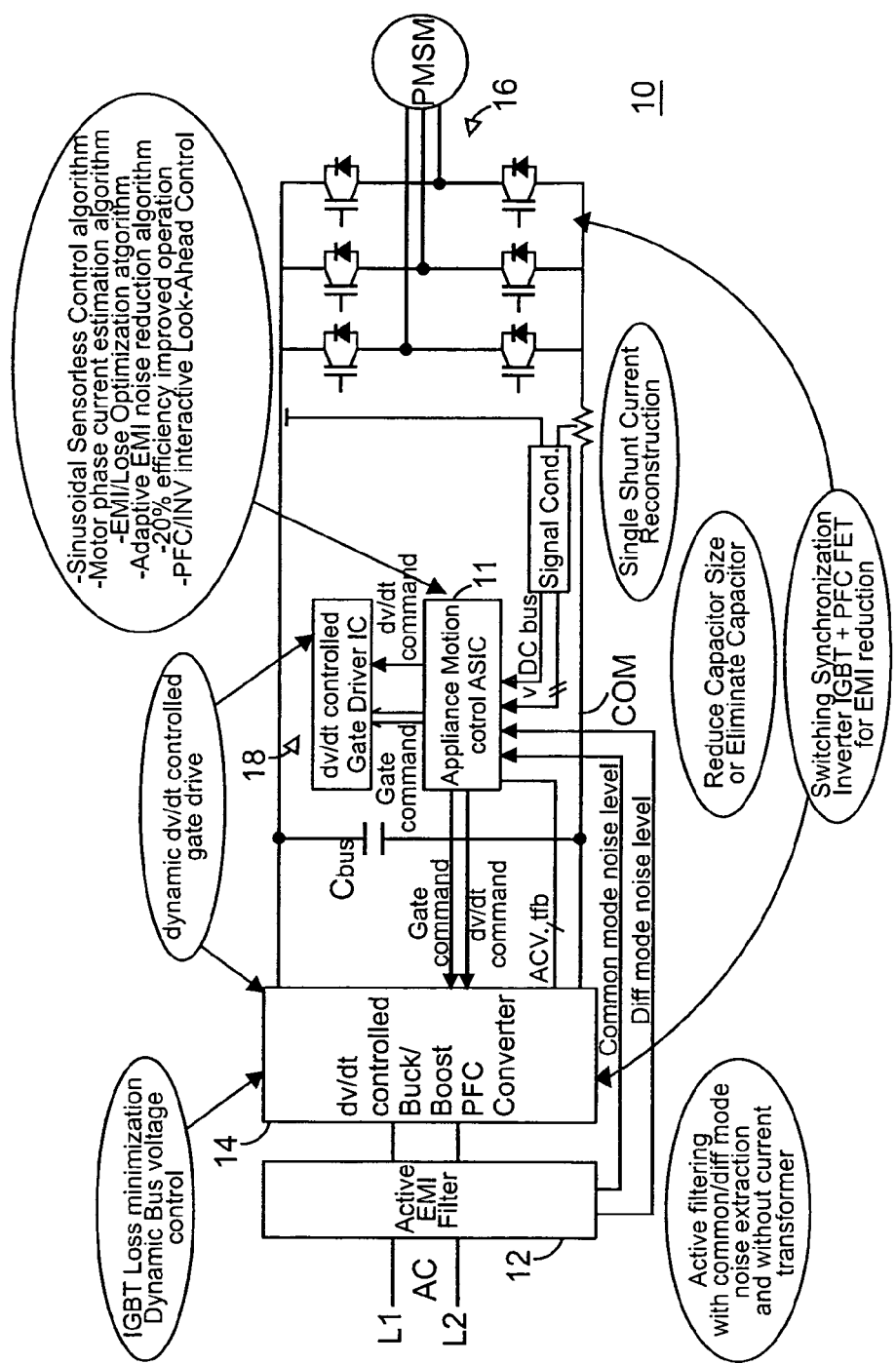
FIG. 1 is a system block diagram of a motor control system according to the present invention.

Referring now to FIG. 1, an overall global closed loop motor control system is illustrated generally as system 10. System 10 includes several major subsystems including an active EMI filter 12, a power factor correction and power converter circuit 14, and an inverter circuit 16 and an inverter control 18. A global system control 11 provides the overall command, control and feedback circuitry and computation for operating drive system 10.

Active EMI filter 12 senses common and differential mode noise on input a-c lines L1, L2 and optionally on a common line COM, and provides a feedback signal to cancel the noise generated in system 10. A detailed discussion of active EMI filter 12, showing various embodiments with circuit diagrams is provided in (IR-2291) copending U.S. Pat. No. 6,775,157, the entire contents of which is hereby incorporated by reference in the present application. Active EMI filter 12 provides excellent noise reduction operation to greatly improve overall efficiency and noise immunity for system 10. Active EMI filter 12 uses active switching without a current transformer to sense and counteract common and differential mode noise on a front end of system 10. By avoiding a current transformer in active EMI filter 12, a more linear noise filtering operation is achieved without the losses associated with current transformer type filtering systems. It should be apparent that appropriately constructed active EMI filters can be located in other sections of motor drive system 10, operating on the same principles as those upon which EMI filter 12 operates.

PFC power converter 14 employs dynamic bus voltage control and switching loss minimization to obtain high performance with increased efficiency. Switching in PFC power converter 14 is controlled by controller 11, which also provides a control signal for the voltage rate of change per unit time (dv/dt). PFC power converter 14 provides feedback to controller 11 indicating operational parameter values to obtain a closed loop control for power factor correction and power conversion in PFC power converter 14.

Gate driver 18 receives a gate command signal from controller 11 to provide conditioned gate signals to the switches in inverter 16. One of the conditioning factors in driving the gate command signals for inverter 16 is a voltage rate of change per unit time (dv/dt), which indicates to gate driver 18 the desired rate of change for the voltage of a given power switch or groups of switches. The signaling provided by controller 11 thus provides a dynamic dv/dt control for gating the switches in inverter 16, as described in greater detail below.

Controller 11 obtains a signal from a shunt in the d-c bus to reconstruct motor drive current without the need of additional and costly current sensors in the motor drive lines. The motor current reconstruction through measurements on the bus is described in detail in U.S. patent application Ser. No. 10/402,107, the entire contents of which is hereby incorporated by reference into the present application. The motor current reconstruction is based on a space vector control algorithm that is a part of the control operations of controller 11.

Controller 11 performs a number of coordinating and synchronizing functions to obtain an overall global closed loop control for system 10. For example, controller 11 provides command signals to PFC power converter 14 and gate driver 18, while reading sensor and feedback information from the d-c bus, active EMI filter 12 and PFC power converter 14. Controller 11 operates with programmed algorithms and intelligence to accomplish a number of optimizing features in system 10. For example, controller 11 orchestrates operation of PFC power converter 14 to minimize switching losses in PFC power converter 14, while providing dynamic bus voltage control. Controller 11 also operates the synchronized switching in both inverter 16 and PFC power converter 14 to reduced compounded EMI produced by nonsynchronous operation.

Controller 11 also includes a number of algorithms for control of the motor drive. For example, controller 11 orchestrates the operation of converter 16 with gate driver 18 to drive the motor in system 10 based on a sinusoidal sensorless control algorithm that does not require feedback from the motor. Another algorithm available in controller 11 is a motor phase current estimation algorithm based on measurements of d-c bus current and space vector control. Because controller 11 has a number of input parameters related to conducted or radiated EMI, as well as switching loss profiles and characteristics, algorithms for operating system 10 to reduce and minimize EMI and switching losses are available. As different operational profiles are applied for the motor drive in system 10, controller 11 provides adaptive loss minimization, bus voltage control and EMI noise reduction. That is, controller 11 has adaptive algorithms that provide dynamic control based on the particular operating characteristics of the system, given the desired motor drive operational characteristics demanded by the application. Controller 11 also applies interactive look ahead control to provide estimates for required operation of PFC power converter 14 and inverter 16. With this type of predictive control, based on desired operational profiles and operational experience, control 11 can boost efficiency of system 10 while reducing requirements for power component readings. For example, capacitor $C_{BUS}$ can have a much lower power rating than that required in the prior art, leading to reduced costs and packaging size.

Figure 2:
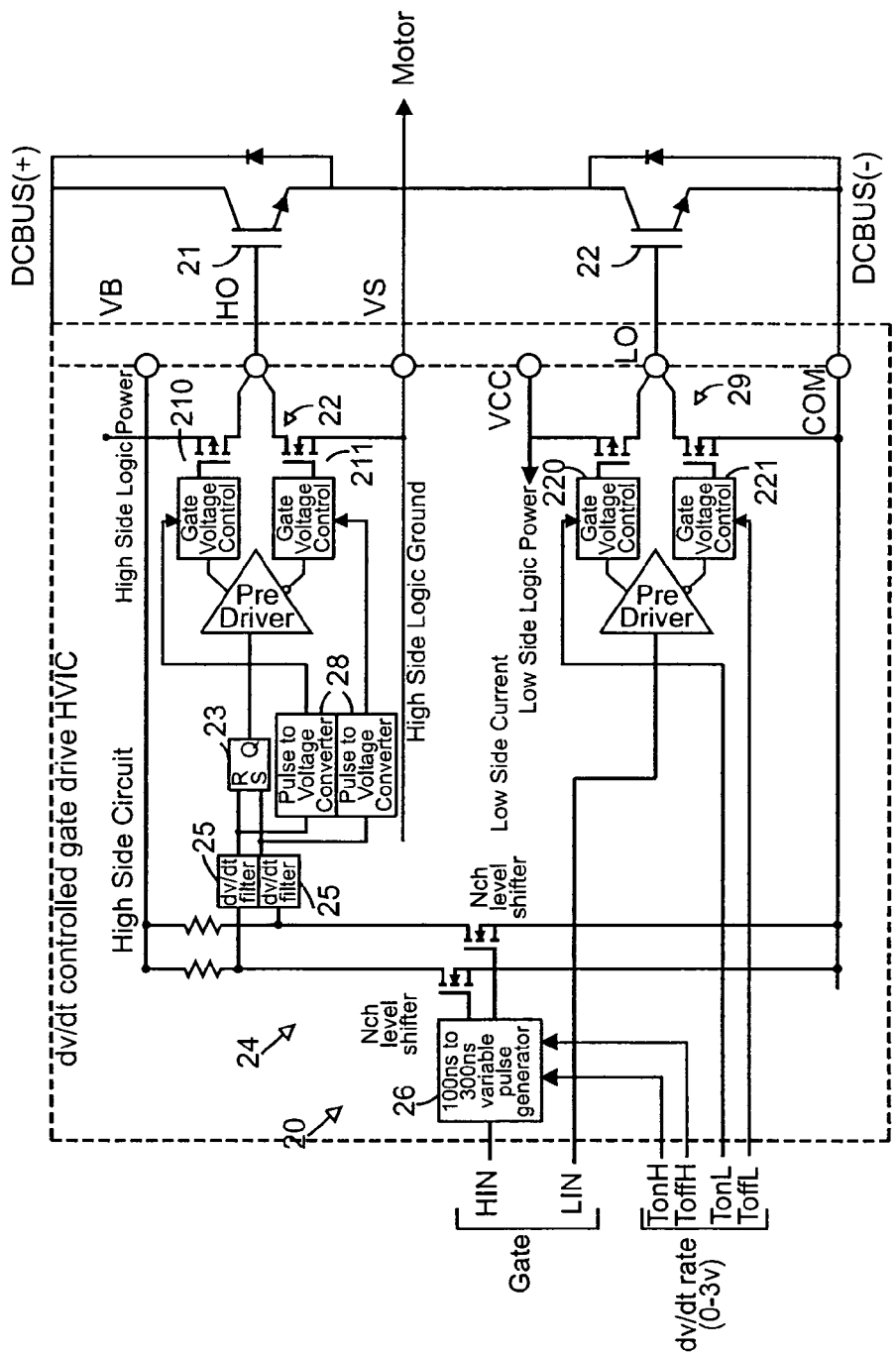
FIG. 2 is a circuit block diagram for a gate drive HVIC with dv/dt control.

Referring now to FIG. 2, the dv/dt control for the power switching stage of system 10 is illustrated generally as gate drive 20. In the illustration of inverter 16 in FIG. 1, three different gate drives 20 are used to control each half bridge of inverter 16 to obtain a desired control profile for the motor. Gate drive 20 receives input controls signals HIN and LIN for control of high and low switches 21, 22, respectively. HIN and LIN are configured and timed so that both switches 21, 22 are not on at the same time. However, the space vector control methodology permits both switches 21, 22 to be off at the same time as provided by the control through inputs HIN and LIN.

Input signal HIN is provided to a level shifting circuit 24 to obtain an appropriate control voltage referenced to a high side logic ground reference VS. Level shifting circuit 24 can be the same as that disclosed in U.S. Pat. No. 5,502,412, the entire disclosure of which is hereby incorporated by reference. Accordingly, level shifting circuit 24 can operate with control signals referenced to any input potential between the line voltage and line voltage return to thereby avoid voltage swings with values less than a fixed ground reference. Level shifting circuit 24 thereby prevents loss of signal or communication between a control circuit and the high voltage, differently referenced, high side switch 21.

The high side gate drive also includes a variable pulse generator 26 that operates on the high voltage input control signal HIN with the dv/dt rate signals TONH and TOFFH, as described in greater detail below. Dv/dt rate signals TONH and TOFFH condition the gate command signal HIN to transmit a specified rate of change over time for the voltage applied to high side switch 21. Gate command signals supplied to input HIN are provided as pulses to reduce the power required to operate level shifting circuit 24. Accordingly TONH and TOFFH manipulate the pulses on input HIN to obtain a set and reset pulse indicative of a length of a pulse supplied to input HIN. The level shifted pulses are supplied to a dv/dt filter 25, for both the set and reset pulses output from variable pulse generator 26. Filters 25 induce a small delay in the set and reset pulses provided to RS flip flop 23, which acts as the drive logic command for gate drive circuit 27. Accordingly, when flip flop 23 is set ON, an upward transition is supplied to gate drive circuit 27, and a high logic signal is delivered to gate driver circuit 27 for the same duration of time as indicated in the gate signal command provided on input HIN. At the end of the pulse duration, flip flop 23 is reset, causing a high to low transition on the input signal to gate drive circuit 27, ending the interval for a switch ON time, for example, of high side switch 21. The set and reset signals supplied by filters 25 are also provided as inputs to pulse to voltage converters 28, which control a gate voltage of CMOS driver switches in gate drive circuit 27. Accordingly, gate voltage control is determined based on switch ON and switch OFF signals, in addition to the voltage signal derived from the length of the pulse output from filters 25. According to this methodology, the rate of change for the voltage per unit time applied to the gate of high side switch 21 is controlled for a specific turn ON and turn OFF profile.

With regard to low side switch 22, there is no level shifting circuitry for gate command signal input LIN. Accordingly, the voltage rate of change command signals TONL and TOFFL are provided directly to the gate voltage control of low side switch driver circuitry 29. Accordingly, the voltage rate of change per unit time applied to the gate of low side switch 22 is directly controlled with the input voltage signals TONL and TOFFL.

The dv/dt control for gate drive 20 helps to reduce noise associated with half bridge switching by controlling the rate of change of the voltage delivered to the gates of the high and low side switches 21, 22. The reduction in noise contributes to the global closed loop control for system 10 to further enhance EMI noise reduction while improving system efficiency. Referring now to FIG. 3, a graph illustrating the relationship between EMI noise produced by rapid dv/dt in the power switches compared to losses in the switches is provided. In particular, the optimized operating points reside in areas closer to the origin of the graph in FIG. 3, and correspond to a lower d-c bus voltage value. The adaptive EMI noise and power loss optimization algorithm seeks a best application solution for EMI noise and power loss reduction taking into account the operating parameters that influence noise and switching losses. For example, as indicated in FIG. 3, reduction of EMI noise through control of the voltage rate of change per unit time influences losses in the power switches, so that an optimized solution will strike a balance between these two related considerations depending on an operating set point.

In determining the optimization methodology, selections can be made based on differential mode noise reduction or common mode noise reduction. For a differential mode noise reduction, dv/dt is made to be slow for the switch ON period, TON. For a common mode noise reduction, dv/dt is slowed for both TON and TOFF.

An illustration of sources of differential mode noise is provided in FIG. 4, for which positive motor current is generated based on the operation of a pair of switches in inverter 16. In the first switch configuration, the high side switch is OFF and the low side switch is ON, and motor current is drawn from the low side rail to feed the motor coil. The low side switch then opens and motor current continues to flow from the low side rail to the motor coil through the free wheeling diode coupled with the low side switch. The next switch sequence closes the high side switch to draw motor current from the high side rail, interrupting or reversing the current flowing through the low side free wheeling diode. The rapid switching of current direction causes high frequency transients in inverter 16, producing high frequency differential mode noise.

Figure 5:
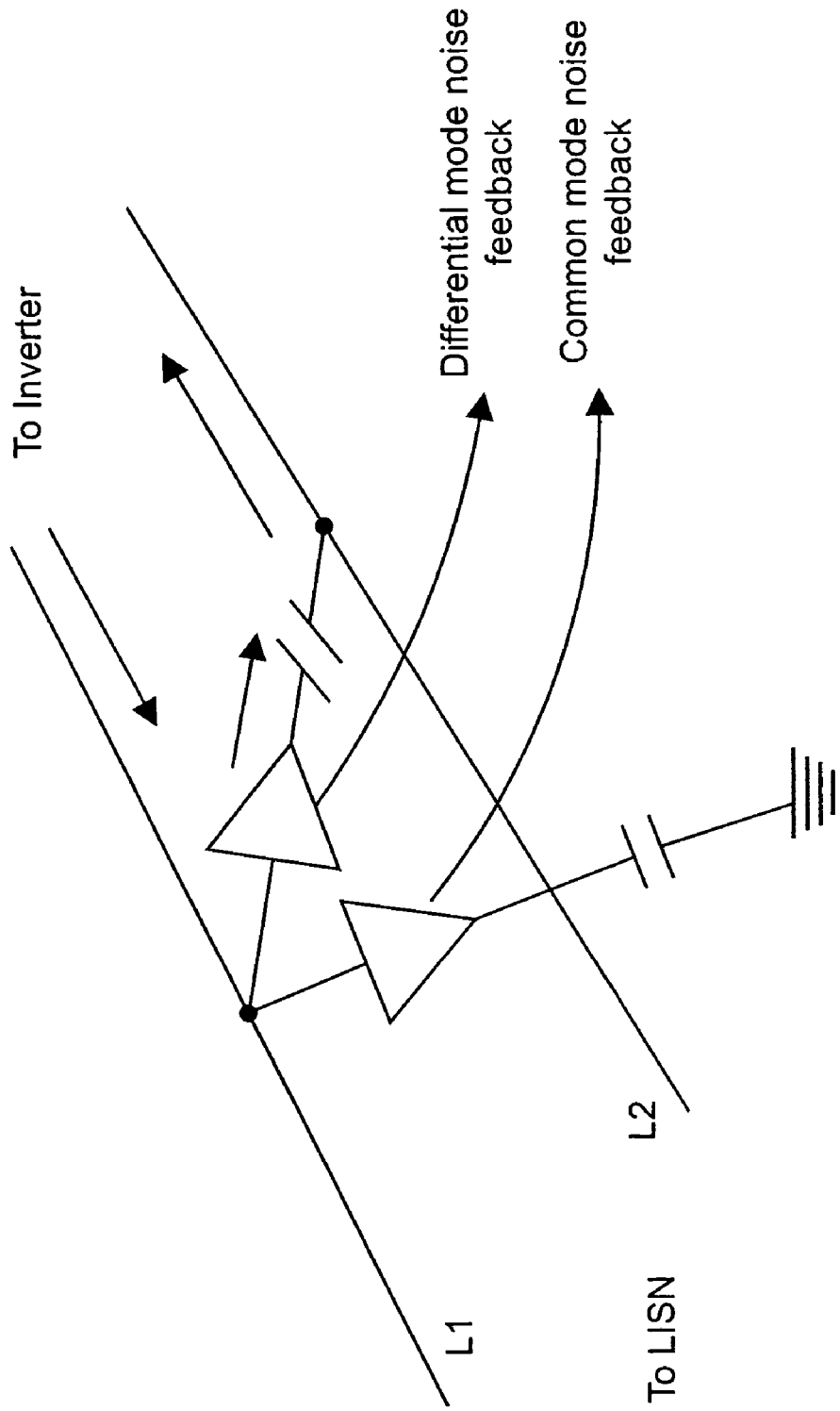
FIG. 5 provides an abstract illustration of how differential and common mode noise impact the system of FIG. 1.

Referring now to FIG. 5, an illustration of the impact of both differential and common mode noise feedback is illustrated. Differential mode noise is typically high frequency noise related to a difference in voltage between lines L1, L2. Lines L1, L2 are modeled as capacitively coupled together to illustrate the impact of differential mode noise. Active EMI filter 12 illustrated in FIG. 1 operates to reduce the differential mode noise by balancing the voltage and high frequency noise current observed on lines L1, L2.

Common mode noise illustrated in FIG. 5 is modeled with a power line capacitively coupled to ground, in this instance power line L1. Voltage differences in the ground line or high frequency noise current flowing through the ground is coupled to the power line and results in both conducted and radiated EMI noise. Again, active EMI filter 12 illustrated in FIG. 1 is configured to reduce common mode noise by sensing and cancelling the high frequency noise current seen on the ground line. When active EMI filter 12 is operated in conjunction with EMI noise and switching loss optimization through control of the dv/dt associated with the switches in inverter 16, an overall system reduction in EMI noise and switching losses can be achieved.

Figure 6:
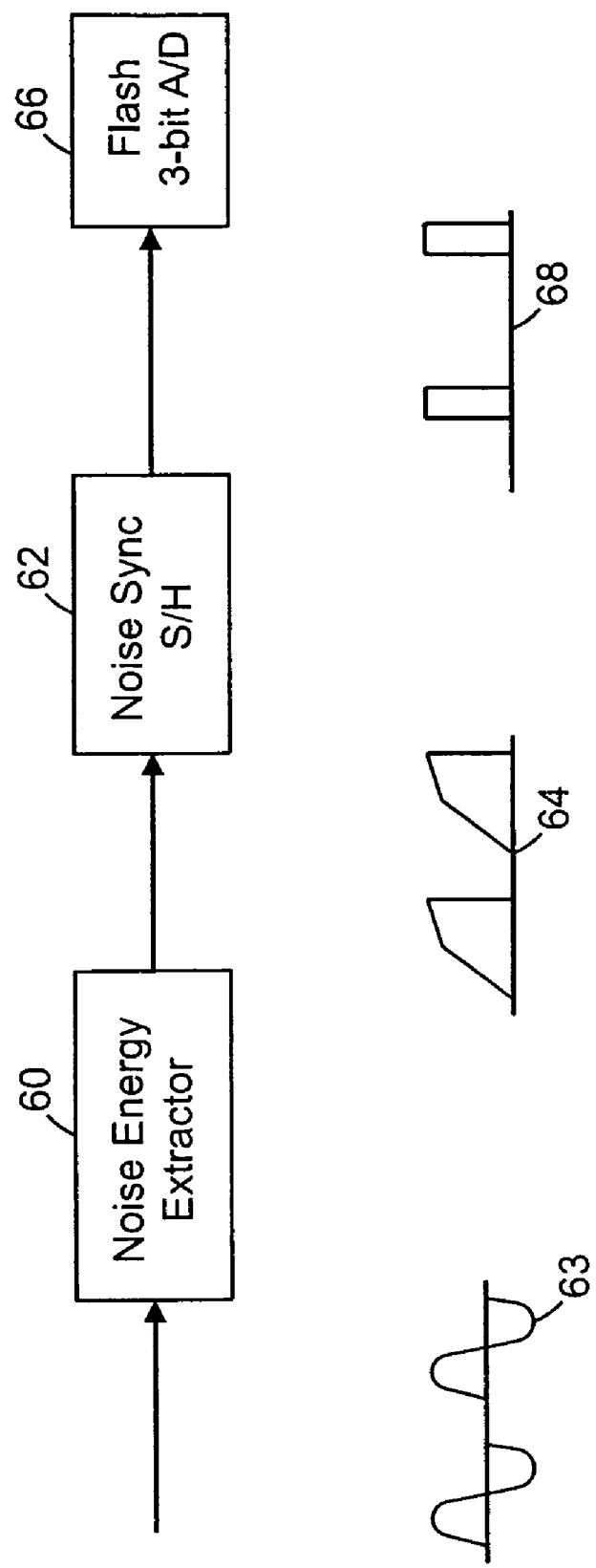
FIG. 6 is a block diagram illustrating operation of the noise sensing feature according to the present invention.

Another feature of the global closed loop control of system 10 is fast noise sensing, which improves the response time to cancel or balance high frequency noise voltages and currents. The fast noise sampling operates by extracting the noise energy from a sensed line, such as a ground line, and converting the extracted energy into a synchronous noise system with a sample and hold circuit. The noise energy extraction and noise synchronization are illustrated as steps 60 and 62 in FIG. 6. The synchronized noise signals illustrated as trapezoidal shaped wave forms 64 are then digitized with a flash three bits analog to digital (A/D) converter 66. The result is a synchronized pulse sequence 68 that is representative of the noise signal waveforms 63, in a digitized format. System controller 11 reads the noise signal information thus obtained and provides operative commands to PFC power converter 14 and gate driver 18, and uses the noise information in the adaptive algorithms used to control noise and reduce losses in system 10.

Application of the analog dv/dt control signal to control the change in voltage per unit time of the power switches in both PFC power converter 14 and inverter 16 is accomplished through several pulse conditioning and voltage ramp circuits. Controller 11 produces analog voltage signals in the range of 0-3V to control the gate voltage of the gate drivers provided for the associated power switches. The dv/dt command signals such as, for example, TONH, TOFFH, TONL and TOFFL contain information related to time periods for delaying or slowing the voltage rate of change per unit time with regard to switch turn on and turn off times. As illustrated in FIG. 2, variable pulse generator 26 produces pulses in the range of 100-300 nanoseconds in proportion to the analog dv/dt command signal value. The timing of the pulses represent set and reset commands determinative of a switching interval for the power switches. The length of the pulse interval in conjunction with the analog dv/dt signal value and the gate command signal determines the value of the rate of change for switching the power switches. For example, referring to FIG. 2, the high side switch control is provided as a series of switch commands on signal input HIN. The switch commands are converted to pulses codifying the switch command and desired dv/dt control. The pulses serve to transmit information without maintaining switches in an ON setting to avoid unnecessary power consumption. In accordance with the circuit shown in FIG. 2, variable pulse generator 26 provides set and reset pulses equivalent to the beginning and end of the gate input control signal HIN. Variable pulse generator 26 also serves to change the length of the beginning and end pulses based on the analog input related to control of the dv/dt rate for the high side power switch.

Figure 7:
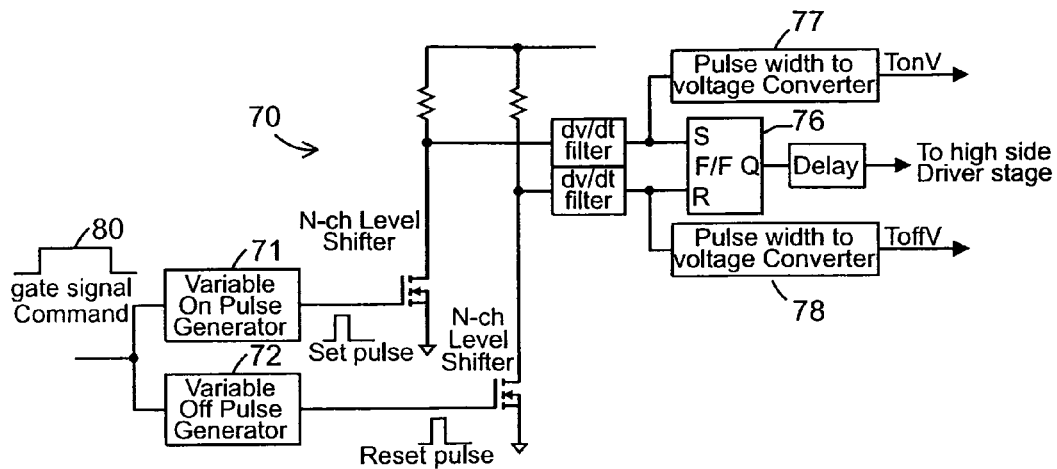
FIG. 7 is a circuit block diagram of the high side gate control according to the present invention.
Figure 8:
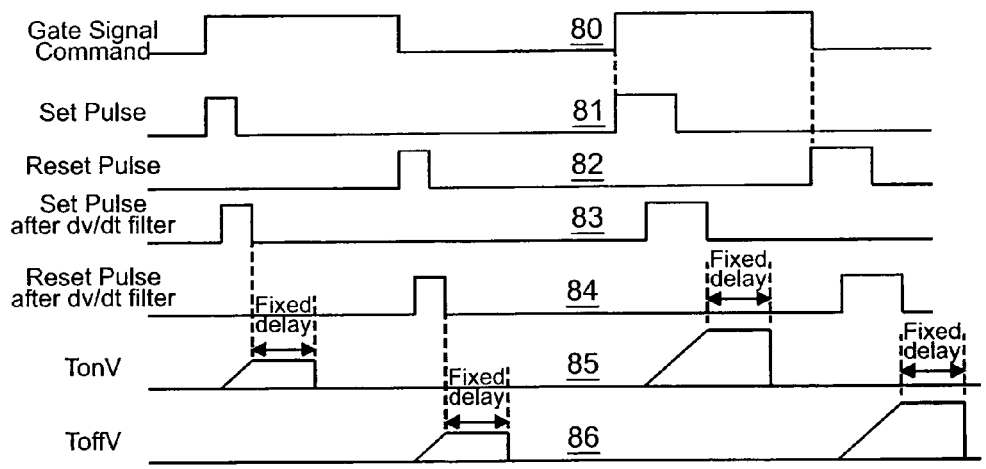
FIG. 8 is a timing diagram illustrating the operation of the dv/dt control in the high side gate driver circuit illustrated in FIG. 7.
Figure 9:
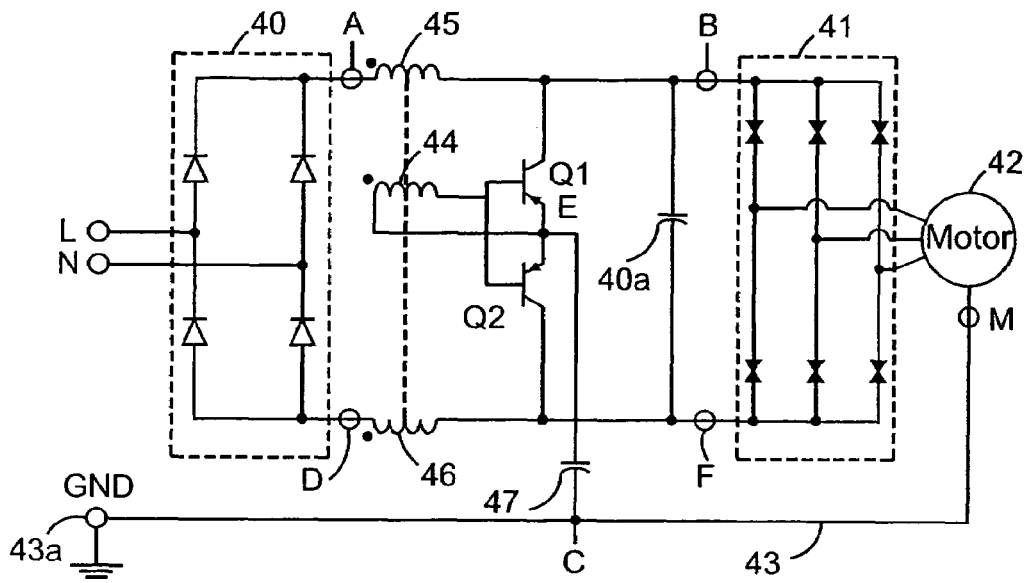
FIG. 9 is a circuit diagram of a known active EMI filter.
Figure 10:
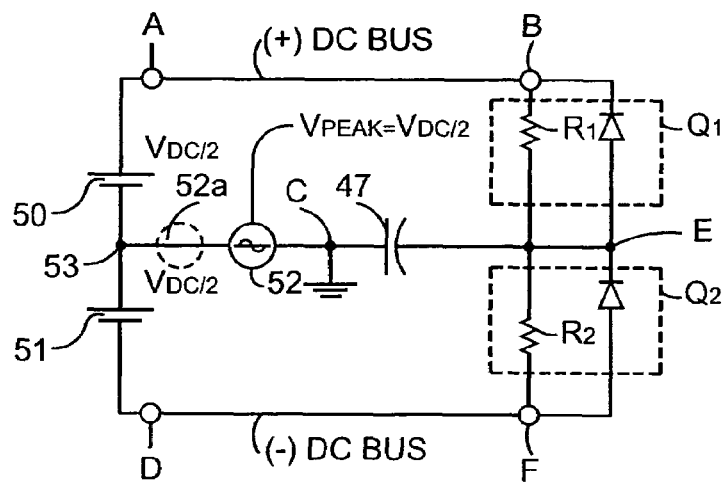
FIG. 10 is a circuit diagram of an equivalent circuit to that illustrated in FIG. 9.

Referring now to FIGS. 7 and 8, a simplified diagram of the dv/dt control feature is illustrated. A circuit 70 is equivalent to the front end of the high side gate driver for gate drive 20. A timing diagram is illustrated in FIG. 8 to explain the operation of circuit 70. A gate command signal 80 is shown input into the two variable pulse generators 71, 72. Pulse generator 71 produces an ON or set pulse 81, while pulse generator 72 produces a reset pulse 82. As can be seen from timing diagrams 80-82, set pulse 81 indicates the start of gate command pulse 80, while reset pulse 82 indicates the end of gate command signal 80. By codifying the gate command signal as pulses rather than a single, long, gate turn on command signal, the gate drive command can be level shifted to the power level associated with high side switch 21 without undue losses that may be incurred by maintaining the N-channel level shifting switches in an ON state for a long period of time.

Pulses 81 and 82 are illustrated as having a variable duration based upon the input analog dv/dt rate command from input signals TONH and TOFFH in FIG. 2. As indicated in FIG. 2, pulses 81, 82 are, for example, in the range of 100 ns to 300 ns. Referring again to FIGS. 7 and 8, the level shifted drive signals based on pulses 81, 82 are delivered to a dv/dt filter that, among other things, provides a specified delay for the pulses 81, 82. The resulting filtered pulse trains 83, 84 are used to set and reset flip flop 76 to reconstruct the gate command signal 80 at the gate drive circuit 27 (FIG. 2) to drive high side switch 21. In addition, pulse width converters 77, 78 input pulses 83, 84 and operate on them to produce the gate voltage control signals TONV (85) and TOFFV (86). Gate voltage control signals TONV and TOFFV drive the CMOS switches used to operate the gate of high side switch 21. Referring to FIG. 8, signals TONV and TOFFV are illustrated as having variable voltage levels based on the duration of pulses 83, 84. Signal TONV begins to ramp upward on the upward transition of the filtered set pulse 83, and levels off at the downward transition or end of pulse 83. Pulse 85 then stays at the voltage value achieved for a fixed duration to attain the proper propagation of all signals in the gate drive control. Similarly, signal TOFFV begins to ramp up on an upward transition of filtered reset pulse 84 and continues to ramp for the duration of filtered reset pulse 84. At the end of filtered reset pulse 84, signal TOFFV is maintained at the voltage reached during the pulse for a fixed time period to again allow propagation of all control signals for appropriate gate drive control. As is clear from a comparison of pulse trains 83 and 84 to signals 85 and 86, the time duration for the ramp up of both TONV and TOFFV is dependent upon the pulse duration of filtered set and reset pulses 83, 84. The value reached at the end of the ramp up indicates how the gate turn ON and turn OFF voltage is applied to adjust switching of the high side power switch 21. With this type of control, the dv/dt for gate turn ON and turn OFF of high side switch 21 can be simply and easily controlled, notwithstanding the transfer of the gate command signals through level shifting circuit 24 (FIG. 2). As is clear from FIG. 2, analog dv/dt rate control signals TONL and TOFFL for low side switch 22 can be used directly with gate voltage controls 220, 221, without the need of translation through a level shifting circuit. Alternately, if the COM line for gate driver 20 is floating with regard to an input control signal, a low side level shifting circuit may be employed to operate gate drive circuit 29 and low side switch 22. In this event, the circuitry and operation would be the same as that provided for the high side circuit.

It should be apparent that the entire gate drive circuit 20 illustrated in FIG. 2 can be implemented on a single high voltage integrated circuit (HVIC). Such an HVIC has inputs HIN, LIN and dv/dt rate control signals, with connections for positive and negative d-c bus lines, high and low gate control lines and a high voltage reference connection VS. An HVIC can be used in each of the three legs for driving the multiphase motor illustrated in FIG. 1. That is, each of the three illustrated half bridges in inverter 16 are controlled by an HVIC incorporating the elements of gate driver 20.

Controller 11 can store a number of algorithms and programs related to different dv/dt profiles and adaptive adjustments based on a given performance criteria. For example, in a very noisy environment, or in high precision or safety intensive applications, the dv/dt rate can be set very low to avoid large amounts of induced, conducted or radiated EMI. The dv/dt settings can also be adjusted to apply for turn ON times or both turn ON and turn OFF times to influence either differential mode or common mode noise, respectively. By permitting flexible application of the dv/dt control, switching losses can be minimized while targeting specific noise production. The analog dv/dt signals applied to gate voltage controls 210, 211 and 220, 221 are held at the desired analog level for a fixed period of time that is approximately equal to or slightly greater than the switch ON or switch OFF time of the main switching devices 21, 22. It should be apparent that the present invention is not limited to a motor drive, but can be applied in a large class of power delivery systems. Accordingly, power switches 21, 22 can be MOSgated devices such as MOSFETs, in addition to IGBTs. In addition, the analog voltages related to the dv/dt rate control that are applied to influence the gates of the CMOS switches in gate drivers 27, 29 bias the CMOS transistor output to control the CMOS output impedance.

A global closed loop drive system has been described that achieves a number of advantages over prior art systems through the coordination of various components and noise reduction techniques to achieve an overall robust and noise resistant system. An active EMI filter is employed without the use of a current transformer to actively filter common and differential mode noise from input a-c lines. The same filtering can be used on the d-c bus output. A buck/boost converter with PFC control is provided to obtain d-c bus voltage, while appearing as a substantially resistive load on the a-c input lines. The power converter is actively controlled to reduce switching losses while obtaining dynamic bus voltage control based on component dynamics and environmental factors such as received noise. In addition, the switch in the PFC converter employs dynamic dv/dt control to further reduce generated noise, and is operated in conjunction with the switches in the system inverter to further reduce EMI production. Inverter switches are controlled with a dynamic dv/dt technique to reduce transients and noise generating events. A sinusoidal sensorless control algorithm implemented in the system control produces high performance with increased efficiency. Motor current phase estimation is conducted with measurements of d-c bus current based on the space vector control algorithm, also implemented in the system controller. Dynamic control of various system components optimizes the system for EMI noise reduction and switching loss reduction. An adaptive algorithm in the system controller provides closed loop EMI noise reduction control to provide further effective noise reduction and system efficiency improvements. The system switches are operated with interactive look ahead control to predict and compensate for operational profiles that are noise generating or switching loss events.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An integrated circuit for supplying gate command signals to a high-side power switch, comprising:
   a gate drive circuit for applying turn on and turn off signals to the power switch;
   a command input circuit for providing set reset pulses to operate the gate drive circuit by processing input control pulses for controlling the high-side power switch and a rate of voltage change per unit time signal for controlling the gate drive circuit to produce a specified voltage applied to a gate of the high-side power switch during turn on or turn off times; and
   a gate voltage control circuit for converting the set and reset pulses to a voltage signal to control the gate drive circuit by varying the high-side power switch turn on and turn off time based on the voltage signal,
   wherein the set and reset pulses indicate a length of the input control pulses supplied to the high-side power switch, further comprising:
   a level shifting circuit coupled to the command input circuit for shifting a voltage level of the set and reset pulses.

2. The integrated circuit according to claim 1, further comprising:
   a second gate drive circuit for providing an output to control a gate of a low power switch; and
   a second gate command input pulse to control the second gate drive circuit;
   a second rate of voltage change per unit time signal input coupled to the second gate drive circuit for controlling a rate of voltage change per unit time for the output provided by the low gate drive circuit.

3. A method for controlling a motor drive system to reduce noise, the motor drive system including at least one pair of high- and low-side power switches having gate terminals and connected between a DC voltage line and a voltage line return, the method comprising the steps of:
   receiving input control pulses for control of the high- and low-side power switches;
   providing rate signals related to a desired rate of change of voltage per unit time for controlling the gates of the high- and low-side power switches in the motor drive system;
   generating set and reset pulses for indicating a length of the input control pulses supplied to the high-side power switch;
   applying the set and reset pulses to a gate driver circuit for the high-side power switch;
   converting the set and reset pulses to a voltage signal to control the gate drive circuit by varying the high-side power switch turn on and turn off time based on the voltage signal; and
   modifying the rate signals based on an adaptive trade off between noise reduction and switching losses in the high-side power switch by changing one of turn on and turn off times of the power switch.

4. The method according to claim 3, further comprising applying a slow voltage rate of change per unit time to turn on the power switch to reduce differential mode noise.

5. The method according to claim 3, further comprising applying a slow voltage rate of change per unit time to turn on and turn off the power switch to reduce common mode noise.

6. The method of claim 3, wherein the input control pulses are configured and timed so that the high- and low-side switches are not on at the same time, the high- and low-side switches being permitted to be off at the same time.

7. The method of claim 3, wherein the step of generating set and reset pulses is achieved by processing the input control pulses and the rate of change signals for the high side gate drive, the rate of change signals conditioning the input control pulses to be transmitted at a specified rate of change over time for the voltage applied to the high-side switch.

8. The method of claim 7, further comprising a step of level shifting the set and reset pulses referenced to any input potential between the DC voltage line and voltage line return for the high-side switch to obtain an appropriate control voltage referenced to a high side logic ground reference, wherein the level shifting prevents loss of signal to the high side power switch and avoids voltage swings with values less than a fixed ground reference.

9. The method of claim 8, further comprising a step of filtering the level shifted pulses to induce a delay in a flip-flop circuit.

10. The method of claim 9, further comprising a step of supplying an upward transition to a gate drive circuit delivering a high logic signal for the same duration of time as indicated by the input control pulses when the flip flop circuit is set ON and causing a high to low transition to gate drive circuit ending the interval for a switch ON time at the end of duration of the input control pulse and resetting the flip flop circuit.

* * * * *